United States Patent
Hu et al.

(10) Patent No.: US 8,753,552 B2
(45) Date of Patent: Jun. 17, 2014

(54) HEAT SINK AND MANUFACTURING METHOD OF POROUS GRAPHITE

(75) Inventors: Hsu-Tien Hu, Hsinchu County (TW); Jiun-Hsu Hsiao, Miaoli County (TW)

(73) Assignee: Shuoen Tech. Co., Ltd, Miaoli (TW)

( * ) Notice: Subject to any disclaimer, the term of this patent is extended or adjusted under 35 U.S.C. 154(b) by 555 days.

(21) Appl. No.: 13/154,868

(22) Filed: Jun. 7, 2011

(65) Prior Publication Data

US 2012/0211212 A1    Aug. 23, 2012

(30) Foreign Application Priority Data

Feb. 18, 2011  (TW) ............................... 100105418 A (51) Int. Cl.
*C01B 31/04*    (2006.01)
(52) U.S. Cl.
USPC ........................................... 264/29.3; 264/49
(58) Field of Classification Search
None
See application file for complete search history.

(56) References Cited

U.S. PATENT DOCUMENTS

| | | | | |
|---|---|---|---|---|
| 3,533,961 A | * | 10/1970 | Voet Andries et al. | 502/418 |
| 4,410,472 A | * | 10/1983 | Grubbs et al. | 44/530 |
| 4,483,840 A | * | 11/1984 | Delhay et al. | 423/445 R |
| 5,236,639 A | * | 8/1993 | Sakagami et al. | 264/29.3 |
| 5,523,049 A | * | 6/1996 | Terpstra et al. | 419/36 |
| 6,099,965 A | * | 8/2000 | Tennent et al. | 428/408 |

OTHER PUBLICATIONS

Nidia C. Gallego et al., "Graphite Foam for Cooling Power Electronics" *Propulsion Materials Fy 2006 Progress Report* pp. 11-16.
James Klett et al., "The Role of Structure on the Thermal Properties of Graphitic Foams" *Journal of Materials Science* 39 (2004) 3659-3676.

* cited by examiner

*Primary Examiner* — Mary F Theisen
(74) *Attorney, Agent, or Firm* — Muncy, Geissler, Olds & Lowe, P.C.

(57) ABSTRACT

A heat sink using porous graphite having graphite particle-stacked porous graphite is provided. The heat sink may provide good heat conductivity and improve strength of carbon foam. Also, a manufacturing method of porous graphite is provided.

14 Claims, 9 Drawing Sheets

HEAT SINK AND MANUFACTURING METHOD OF POROUS GRAPHITE

BACKGROUND OF THE INVENTION

1. Field of the Invention

The present invention relates to an application and manufacturing method of porous graphite, more particularly to a heat sink and manufacturing method of porous graphite.

2. Description of the Prior Art

Up till now, electronic products which have been developed in a miniaturization tendency have achieved nanometer scale chip fabrication; however, the generated heat and radiating heat intensity have kept on increasing as a result. Therefore, it is now an urgent issue to develop material with high performance in heat dissipating so as to solve heat dissipating problems derived from electronic products requiring high power density.

Carbon foam has several excellent properties such as low density, fire resistance, low thermal expansion coefficient and chemical erosion resistance and may be used in heat conduction or heat insulation dependent on different carbon crystal alignment or foaming structure. Carbon foam has been characterized in excellent heat transmission and interconnected open voids which provide a very large specific surface area for heat transmission and heat dissipation. Therefore, carbon foam has been highly regarded as one of the novel heat dissipating material with high potential to solve heat dissipating problems of modern electronics products.

Carbon foam is now mainly produced by heat-treating a mesophase pitch developed by ORNL (Oak Ridge National Laboratory). First, a mesophase pitch precursor is heated, in an oxygen-free environment above its softening point, about 50° C. Once the pitch has melted, the furnace pressure is elevated and the temperature is raised at a controlled rate. While the pitch is molten, it begins to evolve low molecular weight species. These volatile gases form bubbles at nucleation sites on the bottom and sides of the crucible and rise to the top, beginning to orient the mesophase crystals in the vertical direction. With time, a significant amount of the mesophase crystals are oriented vertically. The foamed mesophase is carbonized by heating to between 600° C. and 1000° C. to yield a relatively pure carbon foam. The carbon foam is converted to a graphitic foam by heat treatment to more than 2800° C. under an argon purge.

Figure 5:
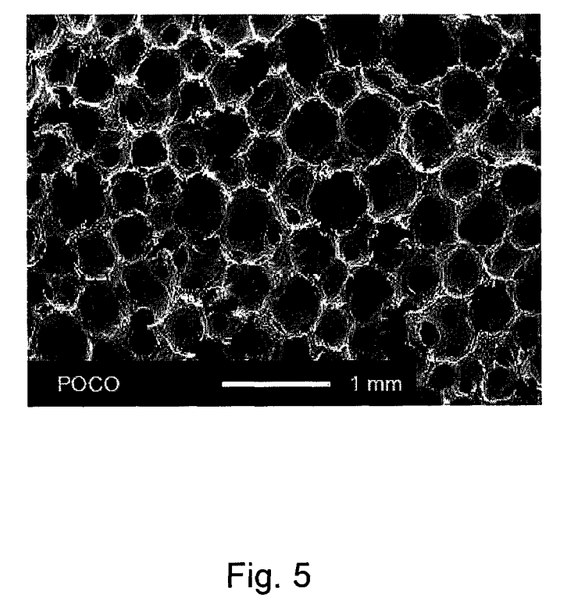
FIG. 5 is a scanning electron microscopy (SEM) photo of a conventional carbon foam.
Figure 6:
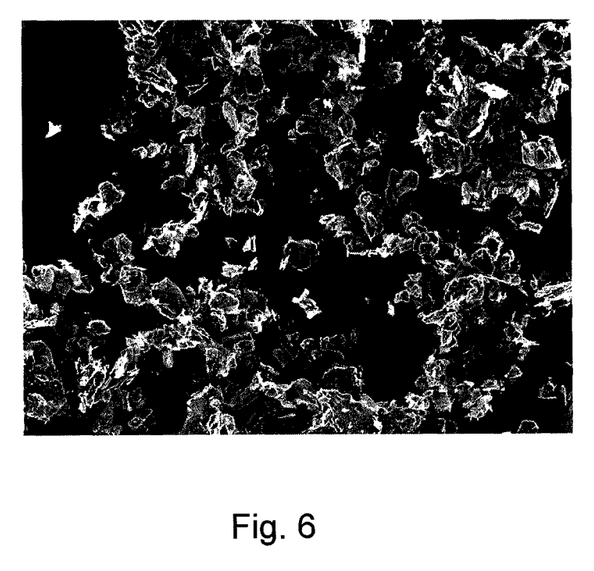
FIGS. 6-9 are photos illustrating flow and product of porous graphite according to a preferred embodiment of the present invention.
Figure 7:
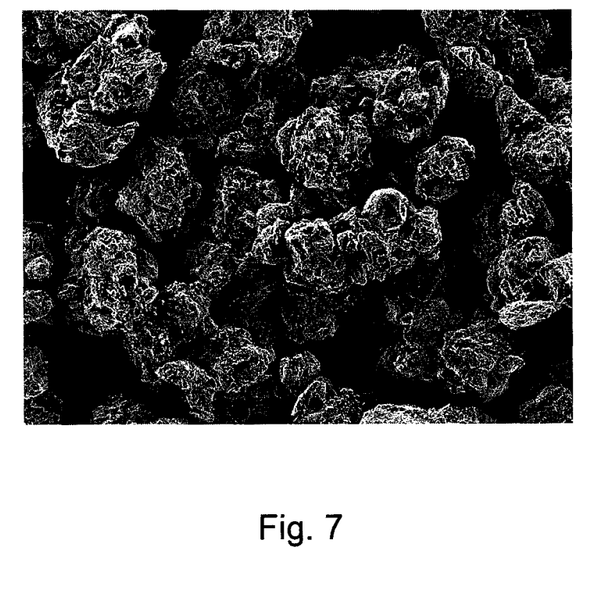
Figure 8:
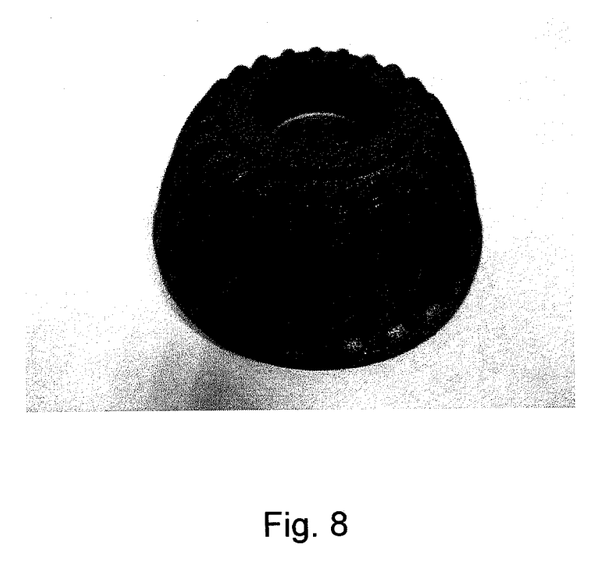

The porosity of the carbon foam is usually greater than 80% (as illustrated in FIG. 5) so that voids of the carbon foam are interconnected but such high porosity results in insufficient physical strength. The carbon foam may be broken when applied with greater stress and may therefore have limitation in application. In addition, there is still room for improvement in manufacturing process and cost for carbon foam manufacturing using heat-treating a mesophase pitch.

To sum up, it is now a current goal to develop a device based on novel graphite material which provides good heat conduction and improved physical strength.

SUMMARY OF THE INVENTION

The present invention is directed to porous graphite stacked with graphite particles and used for heat conductor in a heat sink.

According to an embodiment, a porous graphite heat sink has a main body made of porous graphite stacked with graphite particles.

According to another embodiment, a method for preparing a porous graphite includes a granulation step, a molding step and a heat treatment step. The granulation step includes granulating a mixture comprising graphite powder and a binder to obtain graphite particles having larger particle size than that of the graphite powder. The molding step includes molding the graphite particles into a green body. The heat treatment step includes heating the green body to a predetermined temperature for a predetermined period and then cooling off to obtain porous graphite heat sink.

Other advantages of the present invention will become apparent from the following descriptions taken in conjunction with the accompanying drawings wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed descriptions, when taken in conjunction with the accompanying drawings, wherein.

DESCRIPTION OF THE PREFERRED EMBODIMENT

The present invention is directed to porous graphite stacked with graphite particles and used for heat conductor in a heat sink.

Figure 1:
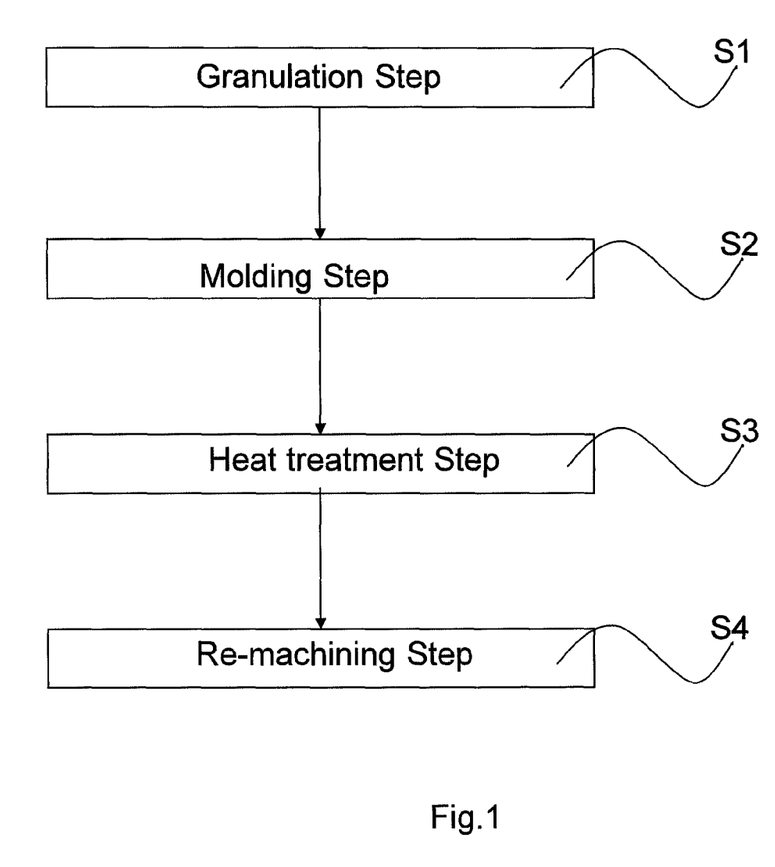
FIG. 1 is a flow chart illustrating a method of manufacturing porous graphite according to one embodiment of the present invention.

FIG. 1 is a flow chart illustrating a method of manufacturing porous graphite according to one embodiment of the present invention. The manufacturing method includes a granulation step S1, a molding step S2, a heat treatment step S3 and a re-machining step S4.

In the granulation step S1, graphite powder and a binder are used for granulation to obtain graphite particles having larger particle size. The graphite powder may be natural graphite, synthetic graphite or a combination thereof. Granulation is performed for obtaining particles having larger and more regular size than that of graphite powder. The size of granulated graphite particles may range from 300 µm~1000 µm, which depends on the adopted manufacturing process and/or composition.

Generally speaking, granulation process may include spheronization granulation or spray granulation. Spheronization granulation is referred to as a method mixing the graphite powder and binder, and rolling to form graphite particles of larger size or cutting the mixture of graphite powder and binder with granulation blade to obtain graphite particles having substantially consistent particle size. Spray granulation is referred to as a method spraying graphite powder and suspending in a chamber and spraying gel or liquid binder with another nozzle so that the binder encapsulates the graphite powder to form graphite particles. Alternatively, the graphite powder and low-viscosity binder mixture is sprayed and dried to form graphite particles.

The above-mentioned binder includes without limitation to pitch, resin, polycarbonate (PC), polyester (PE), polypropylene (PP) or polyethylene terephthalate (PET). In addition, some additives, such as metal powder or ceramic powder, may be added to the mixture in granulation step S1 so as to adjust physical characteristics of the porous graphite. For example, the metal additive may be aluminum, iron or copper; the ceramic additive may be kaolin clay, silica, alumina, aluminum nitride, boron nitride, titanium dioxide or silicon aluminate.

Also, in one embodiment, a foaming agent, such as sodium bicarbonate, ammonium carbonate, azobisisobutyronitrile or azodicarbonamide, may be added in the granulation step S1 so as to adjust and/or increase porosity rate of the obtained porous graphite.

Figure 2:
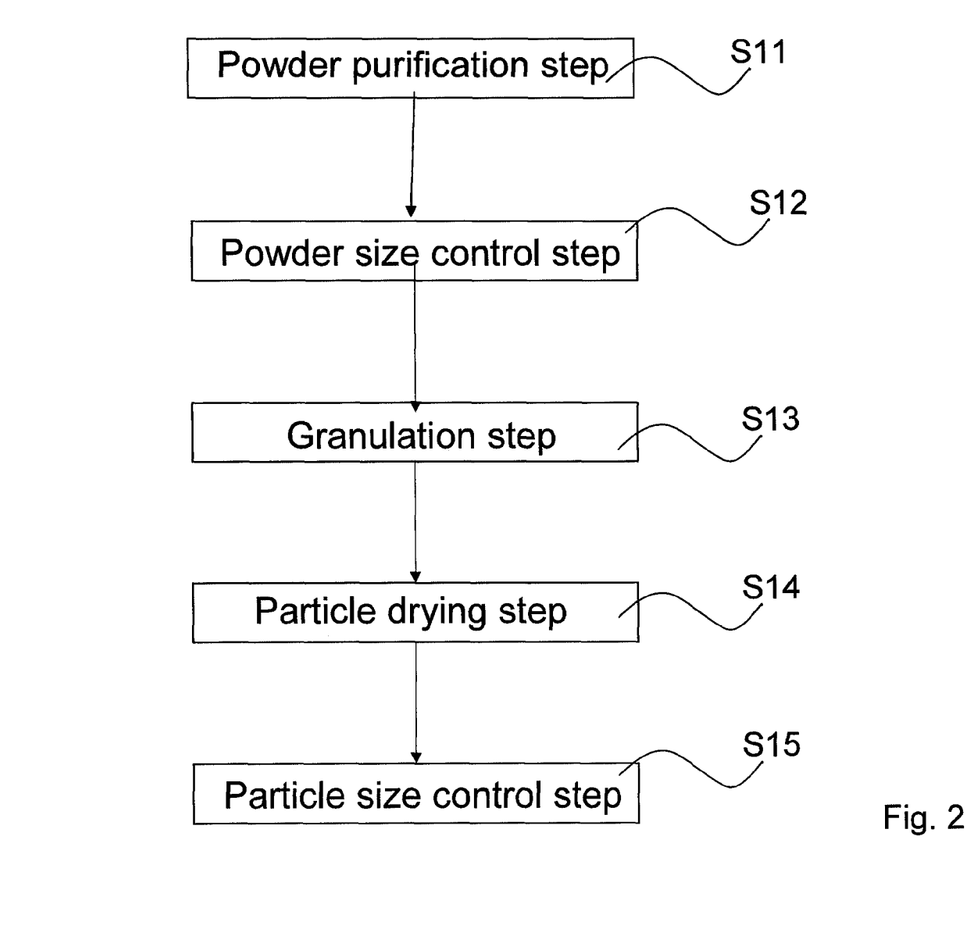
FIG. 2 is a flow chart illustrating a granulation step according to one embodiment of the present invention.

FIG. 2 is a flow chart illustrating a granulation step according to one embodiment of the present invention. Referring to the granulation step S1 illustrated in FIG. 1, some procedures may be performed before or after the granulation step S13 so as to obtain graphite particles of higher quality. For example, in one preferred embodiment, a powder purification step S11 and a powder size-control step S12 are performed to obtain graphite powder of higher quality. The powder purification step S11 may be achieved by acid-base washing purification, alkaline-base washing purification or heat treatment purification to remove impurities contained in the graphite powder. For example, powder purification step S11 is achieved by acid-base washing the graphite powder with sulfric acid and hydrofluoric acid, then heating it for 60 minutes at 2600° C. to remove its impurities. In powder size-control step S12, the purified graphite powder is then pulverized and sieved to 200 µm or below to enhance consistency in quality of the graphite particles by size restriction.

A particle drying step S14 is performed after the graphite granulation step S13 to dry the graphite particles for subsequent press molding or injection molding process. A particle size-control step S15 may be performed after the particle drying step S14 to sieve the graphite particles to obtain granulated graphite particles having more homogenous size.

Still referring to FIG. 1, a molding step S2 is then performed where the graphite particles are molded into a green body. Generally speaking, the molding step S2 may include cold press molding process, hot press molding process or powder injection molding process. In one embodiment, the molding material is pressed into a green body with cold press process applying pressure higher than 100 kg/cm$^2$.

In one embodiment, a mold release agent, including without limitation to zinc stearate, magnesium stearate or wax powder, is added in the granulation step S1 so as to assist the green body detaching from mold.

Here, in one embodiment, in the molding step S2, the graphite particles are molded into a heat sink so as to obtain the porous graphite heat sink of the present invention.

After the molding step S2, a heat treatment step S3 is performed to heat the green body to a predetermined temperature for a predetermined period and then cool off to obtain porous graphite. The heat treatment step S3 is performed for carbonizing, or graphitizing, preferably, the ingredients other than graphite powder in the green body. Carbonization may provide carbonized ingredients with heat conductivity, and graphitization would provide graphitized ingredients with better heat conductivity and thermal dissipation. Therefore, the predetermined temperature in the heat treatment step S3 would be greater than 600° C. so as to achieve carbonization for the green body, and preferably greater than 2300° C. so as to achieve graphitization of the green body.

To be specific, in one embodiment for heat treatment step S3, the green body is placed in a heat furnace, which is then vacuumed and introduced with inert gas having greater than 99% purity, heated to a predetermined temperature, held for a predetermined period with ambient protection of inert gas and then cooled to room temperature so as for the organic additives including binder, foaming agent to be carbonized or graphitized. Here, the inert gas may be helium, neon, argon, krypton, xenon, radon, nitrogen or so on. The cooling method may be performed by using furnace cooling, forced cooling with cool inert gas, fluid cooling or a combination thereof to room temperature. In one embodiment, the protecting gas contains nitrogen having greater than 99% purity, and the green body is heated at 2500° C. for 60 minutes and naturally cooled to room temperature so as to obtain porous graphite.

The porous graphite, with its greater specific surface area caused by the porous structure and its high thermal conductive property inherent from the graphite, is a good alternative of heat dissipation material to achieve good heat dissipation for electronic products with demands of high heat dissipation.

Figure 9:
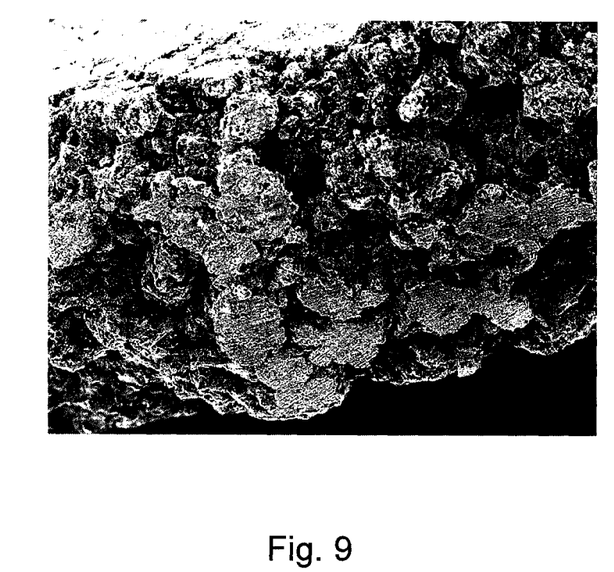

FIGS. 6-9 are pictures taken in each step of the present invention, and respectively illustrate graphite powder (FIG. 6), granulated graphite particles (FIG. 7), a green body for LED lamp cup made of porous graphite (FIG. 8) and cross section of a porous graphite product (FIG. 9). The porous graphite obtained from the above steps is illustrated in FIG. 9 and may be easily distinguished from the carbon foam obtained by using ORNL (Oak Ridge National Laboratory) process (as illustrated in FIG. 5) since the porous graphite of the present invention is stacked with graphite particles and voids are formed among graphite particles.

The porous graphite of the present invention, having porosity rate ranging from 5 to 30%, has better physical strength and is less likely to be broken by stress. Therefore, compared to carbon foam, the porous graphite of the present invention has advantages not only in simpler manufacturing process, less cost but also in good heat conduction and physical strength.

Furthermore, the porous graphite may undergo a re-machining step S4 as illustrated in FIG. 1. In the re-machining step S4, the porous graphite is processed using mechanical working, such as polishing, cutting, drilling and so on. In one embodiment, a porous graphite product may be obtained by mechanical polishing and drilling.

Figure 3:
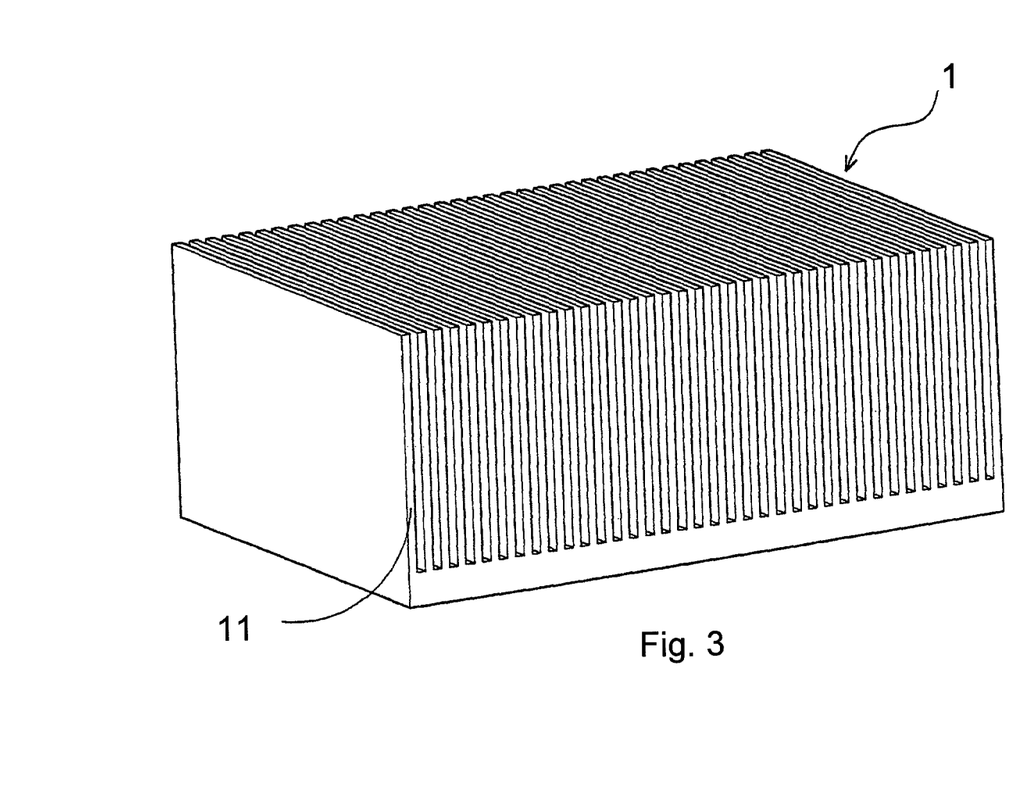
FIG. 3 is a schematic diagram illustrating a heat sink according to one embodiment of the present invention.

FIG. 3 is a schematic diagram illustrating a heat sink according to one embodiment of the present invention. The common heat sources include without limitations to a chip or an LED. Heat generated from the heat sources may be effectively dissipated with assistance of the porous graphite provided with good heat conduction and large specific surface area achieved by porosity.

In addition, the porous graphite heat sink 1 may be implemented in many forms of embodiment. For example, the heat conductor may be configured with fin structure 11 and/or a fan (not illustrated) coupled thereto so as to facilitate heat generated by the heat source flowing in the voids of the porous graphite to enhance heat dissipation.

Figure 4:
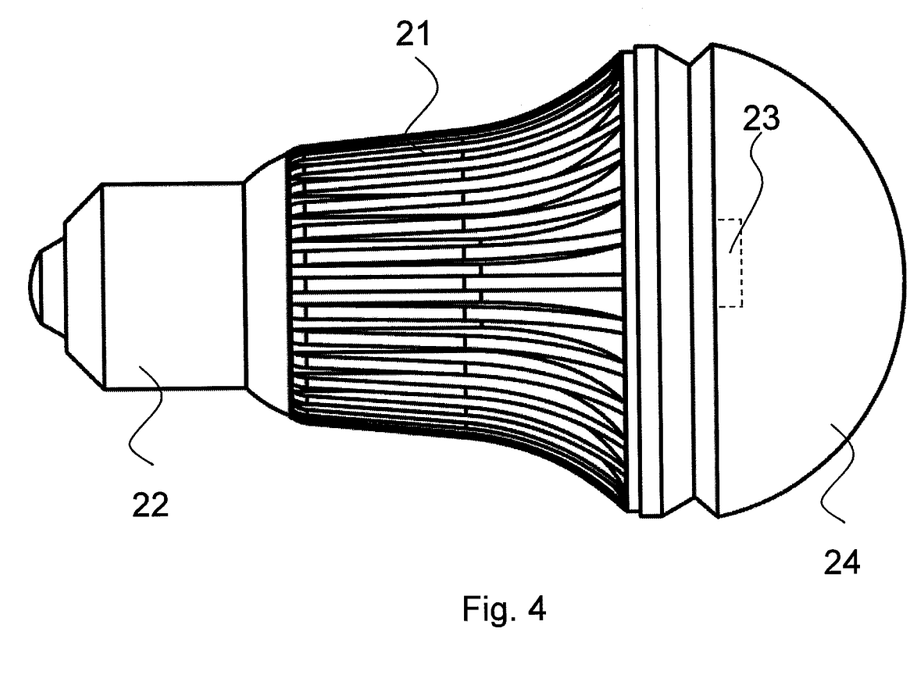
FIG. 4 is a schematic diagram illustrating an LED assembly of the present invention.

In one embodiment, the heat sink of the present invention may be implemented in LED devices for heat dissipation. Here, FIG. 4 is a schematic diagram illustrating an LED assembly of the present invention. The LED assembly of the present invention includes a porous graphite lamp cup 21, a lamp base 22 and at least one LED module 23. The LED module is electrically connected to the lamp base 22. It is understood that the LED assembly may include required electronic components configured for driving the LED module 23 for irradiating light. In one embodiment, the LED assembly may further includes a lamp shade 24 configured for housing and protecting the LED module and also softening and diffusing light irradiated from the LED module 23.

A plurality of fins are formed on the surface of the porous graphite lamp cup 21. The outer rim surface of the lamp cup 21 is increased by the fin structure so as to dissipate heat generated by the LED module 23. The inner surface of the lamp cup may be provided with a reflecting layer (no illustrated), which may be made of silver.

Furthermore, a protecting layer and/or an insulating layer may be provided on the surface of the heat conductor so as to improve the quality thereof. In one embodiment, the protecting layer and the insulating layer may be made of ceramics.

To sum up, the present invention provides porous graphite which is stacked with graphite particles and has advantages in good heat conduction and improved physical strength, and it may be applied as a heat sink with good heat dissipation efficiency.

While the invention can be subject to various modifications and alternative forms, a specific example thereof has been shown in the drawings and is herein described in detail. It should be understood, however, that the invention is not to be limited to the particular form disclosed, but on the contrary, the invention is to cover all modifications, equivalents, and alternatives falling within the spirit and scope of the appended claims.

What is claimed is:

1. A method for preparing a porous graphite, including:
  a granulation step for granulating a mixture comprising graphite powder and a binder to obtain graphite particles having larger particle size than that of the graphite powder;
  a molding step for molding the graphite particles into a green body; and
  a heat treatment step for heating the green body to a predetermined temperature for a predetermined period and then cooling off to obtain porous graphite heat sink.

2. The method as claimed in claim 1, wherein the graphite powder includes natural graphite, synthetic graphite or a combination thereof.

3. The method as claimed in claim 1, wherein the granulation step is achieved by spheronization granulation or spray granulation.

4. The method as claimed in claim 1, wherein the binder includes pitch, resin, polycarbonate (PC), polyester (PE), polypropylene (PP) or polyethylene terephthalate (PET).

5. The method as claimed in claim 1, wherein a metal powder, ceramic powder, a foaming agent or a mold release agent is added to the mixture in the granulation step.

6. The method as claimed in claim 5, wherein the foaming agent includes sodium bicarbonate, ammonium carbonate, azobisisobutyronitrile or azodicarbonamide.

7. The method as claimed in claim 5, wherein the mold release agent includes zinc stearate, magnesium stearate or wax powder.

8. The method as claimed in claim 1, wherein the molding step is achieved by cold press molding process, hot press molding process or powder injection molding process.

9. The method as claimed in claim 1 further comprising a size control step for controlling sizes of the graphite powder or the graphite particles.

10. The method as claimed in claim 1 further comprising a drying step for drying the graphite particles.

11. The method as claimed in claim 1, wherein the predetermined temperature in the heat treatment step is greater than 600° C.

12. The method as claimed in claim 1, wherein the heat treatment step is performed in a vacuum or inert gas-filled environment.

13. The method as claimed in claim 1 further comprising a re-machining step for machining the porous graphite having a porous structure by mechanical working to obtain a porous graphite product.

14. The method as claimed in claim 1, wherein the graphite particles are molded into a heat sink in the molding step.

* * * * *